United States Patent
Grewing et al.

(10) Patent No.: US 7,317,768 B2
(45) Date of Patent: Jan. 8, 2008

(54) DEMODULATOR AND DEMODULATION METHOD FOR DEMODULATING RECEIVED SIGNALS

(75) Inventors: Christian Grewing, Düsseldorf (DE); Markus Hammes, Dinslaken (DE); André Hanke, Düsseldorf (DE); Stefan Van Waasen, Duisburg (DE)

(73) Assignee: Infineon Technologies AG, Munich (DE)

( * ) Notice: Subject to any disclaimer, the term of this patent is extended or adjusted under 35 U.S.C. 154(b) by 428 days.

(21) Appl. No.: 10/485,975

(22) PCT Filed: Jun. 7, 2002

(86) PCT No.: PCT/DE02/02091

§ 371 (c)(1),
(2), (4) Date: Nov. 5, 2004

(87) PCT Pub. No.: WO03/017464

PCT Pub. Date: Feb. 27, 2003

(65) Prior Publication Data

US 2005/0063490 A1   Mar. 24, 2005

(30) Foreign Application Priority Data

Aug. 6, 2001   (DE) ................ 101 38 567

(51) Int. Cl.
*H03D 3/00*   (2006.01)

(52) U.S. Cl. ................ 375/322; 375/316; 375/324

(58) Field of Classification Search ................ 375/322, 375/324, 316
See application file for complete search history.

(56) References Cited

U.S. PATENT DOCUMENTS 4,558,284 A    12/1985   Zaidenweber
(Continued)

FOREIGN PATENT DOCUMENTS

DE         198 10 558 A1    9/1999
(Continued)

OTHER PUBLICATIONS

"The First Very Low-IF RX, 2-Point Modulation TX CMOS System On Chip Bluetooth Solution", C. Durdodt, M. Friedrich, C. Grewing, M. Hammes, A. Hanke, S. Heinem, J. Oehm, D. Pham-Stabner, D. Seippel, D. Theil, S. Van Waasen and E. Wagner, 2001 IEEE Radio Frequency Integrated Circuits Symposium, pp. 99-102.
(Continued)

*Primary Examiner*—David C. Payne
*Assistant Examiner*—Rahel Guarino
(74) *Attorney, Agent, or Firm*—Eschweiler & Associates, LLC

(57) ABSTRACT

The invention relates to a demodulator and also a demodulation method and enables a reliable demodulation even when the intermediate frequency range overlaps the range of the data frequencies of the signal. For this purpose, a rapidly oscillating output signal is generated from the in-phase signal and also the quadrature signal, the sign of which output signal varies in a manner dependent on the product of the signs of the in-phase signal and of the quadrature signal. Either an XOR gate or a multiplier stage may be used in order to generate an output signal of this type.

21 Claims, 3 Drawing Sheets

U.S. PATENT DOCUMENTS

| | | | |
|---|---|---|---|
| 4,577,158 A | | 3/1986 | Kuroda |
| 5,974,096 A | | 10/1999 | Seki et al. |
| 6,985,541 B1 | * | 1/2006 | Luff .......................... 375/324 |
| 2002/0043557 A1 | * | 4/2002 | Mizoguchi et al. ......... 235/375 |

FOREIGN PATENT DOCUMENTS

| EP | 417 528 A2 | 3/1991 |
|---|---|---|
| EP | 417528 A2 * | 3/1991 |
| GB | 2 351 623 A | 1/2001 |

OTHER PUBLICATIONS

International Search Report, International Application No. PCT/DE02/02091, International Filing Date Jun. 7, 2002, 4 pgs.

* cited by examiner

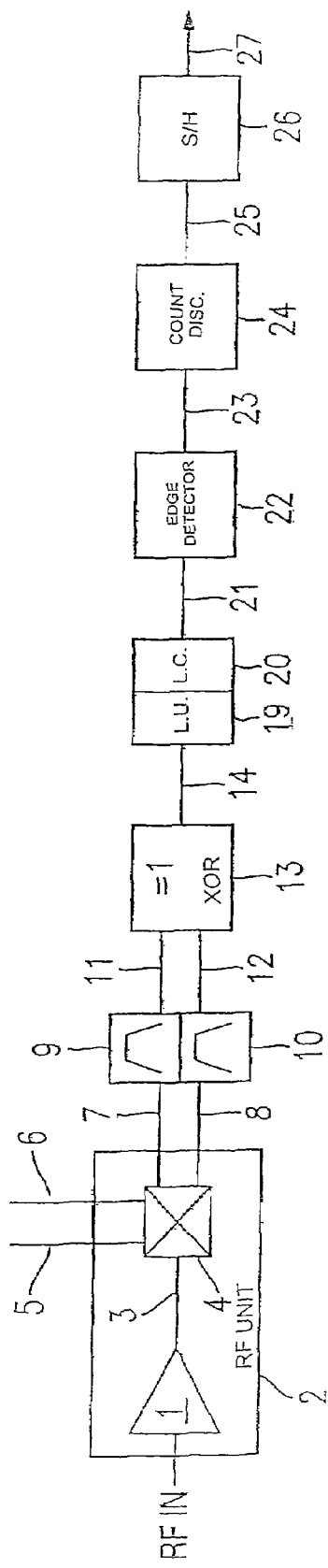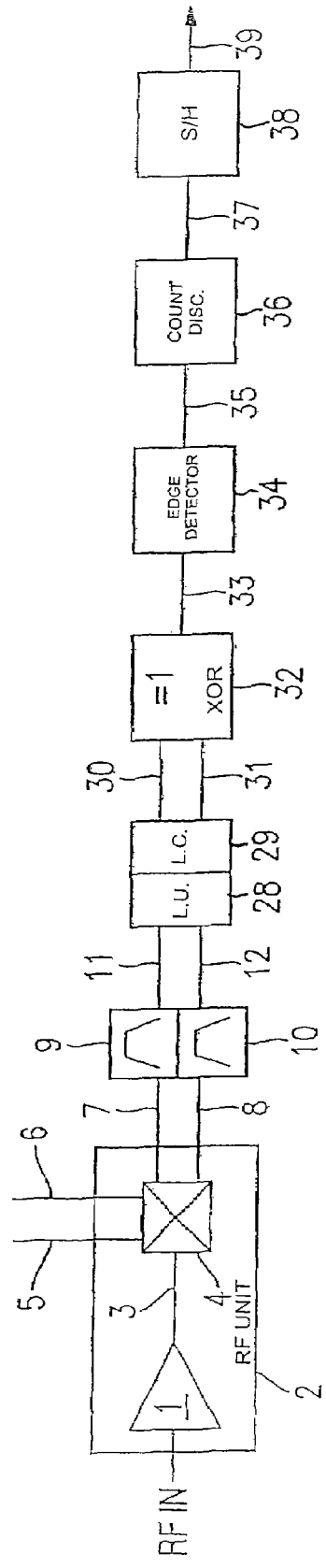

DEMODULATOR AND DEMODULATION METHOD FOR DEMODULATING RECEIVED SIGNALS

RELATED APPLICATION

This application is a National Stage filing of International Application No. PCT/DE02/02091 filed Jun. 7, 2002, which is entitled "Demodulator and Demodulation Method for Demodulating Received Signals", which was not published in English, that claims priority to German Patent Application No. 101 38 567.6 filed on Aug. 6, 2001, and both are hereby incorporated by reference in their entirety.

FIELD OF THE INVENTION

The invention relates to a demodulator for demodulating radiofrequency signals, and in particular mobile radio signals. Furthermore, the invention relates to a method for demodulating radiofrequency signals.

BACKGROUND OF THE INVENTION

In order to be able to demodulate received signals which have been transmitted via a radio channel, the radiofrequency received signals are usually first of all downconverted to a lower frequency. The further signal processing then takes place at this intermediate frequency. In this case, the received signals may be downconverted either to the frequency zero or to an intermediate frequency other than zero. After the signals have been downconverted, it must be ensured that only those signal components which lie within the frequency band defined by the channel are fed to the further processing stages. For this purpose, a channel filter is provided, which suppresses the undesirable frequency components. Said channel filter may be a bandpass filter, and in particular a complex bandpass filter. In the case of a complex bandpass filter, image frequency components which would lie within the passband range are also suppressed. In particular, the channel filter may be designed as a polyphase filter.

It has been found that channel filters provided for the processing of signals with a relatively high intermediate frequency can be integrated on the chip only with difficulty. Moreover, complying with the tolerances required for the signal processing on the chip poses problems in the case of receiver architectures with a relatively high intermediate frequency. Therefore, a transition has been made to the use of so-called low-IF architectures (IF: Intermediate Frequency), in which the received signal is downconverted to a relatively low-frequency intermediate frequency approximately corresponding to the frequency spacing between the individual channels. The implementation of the channel filters on the chip does not pose any problems when using low-frequency carrier frequencies. The required tolerances can also be complied with here. However, problems arise during demodulation due to the low carrier frequency of the downconverted signal, which lies in a range in which the signal spectrum has a still significant component.

The demodulator for a low-IF architecture has hitherto usually been embodied as a quadricorrelator. In a quadricorrelator, the in-phase and quadrature signals coming from the mixer are fed to a filter whose limiting frequency approximately corresponds to the carrier frequency of the in-phase and quadrature signals fed. This filter, which may be designed as a polyphase filter, for example, causes a frequency-dependent phase shift of the input signals. Afterward, the phase-shifted signals occurring at the output of the filter are cross-correlated with the in-phase and quadrature signals present at the input of the filter. This yields a low-frequency signal whose amplitude is a measure of the phase shift effected by the filter. The frequency modulation of the input signal can be tracked on the basis of this low-frequency signal. This signal can subsequently be evaluated further by means of a decision unit.

However, superposed on this useful signal is an undesirable, higher-frequency component which, although it can be suppressed in part by summation of the demodulated in-phase and quadrature signals, nevertheless appreciably disturbs the further evaluation. Particularly in the case of nonlinearities and mismatches in the circuit, this disturbance signal may have considerable amplitude. Owing to the low carrier frequency in low-IF architectures, the frequency of the disturbance signal is near to the spectrum of the data signal. A subsequent filtering which could mask out this disturbance signal becomes very difficult as a result. A further disadvantage when using quadricorrelators is the relatively high outlay on circuitry which is necessary to implement them.

SUMMARY OF THE INVENTION

Therefore, it is an object of the invention to provide a demodulator and also a method for demodulating radiofrequency signals with which it is possible to realize a low-outlay and reliable demodulation of the received signal when using a low-frequency intermediate frequency.

The invention's demodulator for demodulating radiofrequency signals, and in particular mobile radio signals, has a mixer, which downconverts the radiofrequency signal into an intermediate frequency range, the mixer generating an in-phase signal and also a quadrature signal. Moreover, the demodulator comprises a signal converter unit, which converts the in-phase signal and also the quadrature signal into an output signal of increased carrier frequency. In this case, the signal converter unit varies the sign of the output signal in a manner dependent on the product of the signs of the in-phase signal and of the quadrature signal. Furthermore, the demodulator comprises means for determining the period duration or the frequency of the output signal generated by the signal converter unit.

The demodulator according to the invention enables a reliable demodulation even when the intermediate frequency is chosen to be so low (for example 1 MHz) that it corresponds in terms of order of magnitude to the higher frequencies of the signal spectrum. With the use of the solution according to the invention, a demodulation is possible even when the intermediate frequency range overlaps the range of the data frequencies of the signal.

Given a carrier frequency chosen to be so low, it is not always possible to detect the frequency modulation of the in-phase signal by repeated determination of the period duration. By virtue of the low carrier frequency, the rate of events per transmitted data symbol is too low for a continuous tracking of the frequency modulation. The same applies to the quadrature signal.

The invention is based on the idea that a rapidly varying signal can be generated from the in-phase signal and the quadrature signal, and its event rate per symbol is sufficiently high to enable a continuous tracking of the frequency modulation by measurements of the period duration. This output signal of increased carrier frequency is generated by means of a signal converter unit, which varies the sign of the output signal in a manner dependent on the product of the signs of the in-phase signal and of the quadrature signal.

Upon each zero crossing of the in-phase signal, the output signal of the signal converter unit therefore also changes its sign. The sign of the output signal is also changed correspondingly as a result of a zero crossing of the quadrature signal. Since the zero crossings of the in-phase signal and the zero crossings of the quadrature signal coincide only very rarely, the output signal of the signal converter unit has approximately twice the number of zero crossings than the in-phase signal or the quadrature signal alone. The carrier frequency of the output signal of the signal converter unit is therefore approximately twice as high as the carrier frequency of the in-phase signal or of the quadrature signal, and, as a result, the event rate per transmitted symbol becomes large enough to be able to track the frequency modulation.

For this purpose, provision is made of means for determining the period duration, which in each case detect and output the period duration between successive zero crossings of the output signal. As an alternative to this, provision may be made of means for determining the frequency, which in each case measure the frequency of the output signal between two successive zero crossings. In this way, the means for determining the period duration or the frequency generate a sequence of values from which the transmitted data symbols can be obtained.

The demodulator according to the invention makes it possible to use very low intermediate frequencies which overlap the range of the data frequencies of the signal. This is advantageous in particular for the design of the channel filters which are arranged between the mixer and the signal converter unit and the limiting frequencies of which can be chosen to be correspondingly low. The implementation and integration of the channel filters on the receiver modules is therefore possible without any problems. It is also possible to comply with the critical tolerances for the signal processing in the receiver.

However, the demodulator according to the invention is also suitable for use with multistage mixers, which firstly downconvert the radiofrequency signal to a first intermediate frequency signal, then filter said intermediate frequency signal and subsequently downconvert the filtered signal to a second intermediate frequency.

The invention's stratagem of combining the in-phase signal and also the quadrature signal to form a more rapidly varying output signal makes it possible to build a demodulator which is constructed very simply but which can nevertheless demodulate the received radiofrequency signal with high reliability. An attractive alternative solution to the quadricorrelator used hitherto is thereby made available. The signal converter unit, which varies the sign of the output signal in a manner dependent on the product of the signs of the in-phase signal and of the quadrature signal, can be realized with a low outlay on circuitry, for example by means of an XOR gate or with the aid of a multiplier unit. The outlay on circuitry for implementing the demodulator according to the invention is less than in the case of the solutions of the prior art. As a result, the required chip area is reduced, and the fabrication costs are also reduced. The demodulator according to the invention is therefore simpler, cheaper and smaller than the quadricorrelator used hitherto, with no impairment of the reliability of the demodulation.

In accordance with one advantageous embodiment of the invention, the demodulator comprises channel filters for the in-phase signal and the quadrature signal, which are connected downstream of the mixer and suppress, at least in part, frequencies outside the intermediate frequency range. The use of channel filters in the reception path is important in order to be able to distinguish the received signals associated with one specific channel from the signals of other channels. In the solution according to the invention, the channel filters are arranged between mixer and signal converter unit. For the selection of the desired channel, the frequencies lying outside the intermediate frequency range are suppressed, at least in part. Since the solution according to the invention permits the use of a low-frequency intermediate frequency, the limiting frequencies of the channel filter may also be chosen to be correspondingly low, and the implementation of the channel filter on the chip therefore does not pose any problems.

In this case, it is advantageous if the channel filters are bandpass filters, and in particular complex bandpass filters. A bandpass filter can be used to define the lower and also the upper limiting frequency for the permitted intermediate frequency range. Frequencies outside the intermediate frequency range are greatly attenuated by the bandpass filter. A complex bandpass filter can, in addition, also effectively suppress image frequency components which would be mixed into the permitted intermediate frequency range. Therefore, only the signal components which are associated with the channel of interest are really fed to the downstream signal processing.

In accordance with one advantageous embodiment of the invention, the signal converter unit comprises means for the XOR combination of the in-phase signal and of the quadrature signal. With the aid of an XOR gate, it is possible to vary the sign of the output signal of the signal converter unit in a manner dependent on the product of the signs of the in-phase signal and of the quadrature signal. This can be comprehended in a simple manner with reference to the truth table for the XOR combination: if both inputs of the XOR gate are at "0" or both inputs are at "1", then the signal value "1" results at the output of the XOR gate. Thus, if the signs of the in-phase signal and of the quadrature signal correspond, then a positive sign results for the output signal. In contrast, if the signal values of the input signals of the XOR gate deviate from one another, that is to say if the "0" is present at the first input and the "1" is present at the second input or the "1" is present at the first input and the "0" is present at the second input, then the value "0" results at the output of the XOR gate. This means that the case of opposite signs of the in-phase signal and of the quadrature signal results in a negative sign of the output signal of the signal converter unit. Using means for XOR combination of the in-phase signal and of the quadrature signal, it is therefore possible to vary the sign of the output signal in a manner dependent on the product of the signs of the in-phase signal and of the quadrature signal. XOR gates can be implemented with a low outlay on circuitry and require only little space on the chip.

In this case, it is advantageous, in particular, if the in-phase signal and the quadrature signal are embodied as analog signals, and if the means for the XOR combination of the in-phase signal and of the quadrature signal are embodied using analog technology. The mixer downconverts the radiofrequency received signal into the intermediate frequency range and thus generates an analog in-phase signal and also an analog quadrature signal. Therefore, it is advantageous to embody the means for XOR combination using analog technology because the in-phase and quadrature signals generated by the mixer can then be processed without further conversion. Implementation of the XOR gate using analog technology has the advantage, moreover, of only a low current consumption. By oversampling the output signal of the XOR gate, a digital further processing of the signals may be provided even in the case of an analog implementation of the XOR gate.

In accordance with a further embodiment of the invention, the signal converter unit comprises means for the limiting and level matching of the in-phase signal and of the quadrature signal and in that the means for the XOR combination of the in-phase signal and of the quadrature signal are embodied using digital technology and combine the limited, level-matched signals. A "limiter", in principle, represents an amplifier which amplifies the analog in-phase and quadrature signals supplied by the mixer to such a great extent that a slightly positive input value is converted into a positive maximum value. Correspondingly, a negative input value is converted into a negative minimum value. The analog in-phase or quadrature signal is thus converted into a signal having only two signal levels, a positive maximum level and also a negative minimum level. A digitization of the input signal is virtually achieved as a result.

A typical limiter supplies a signal having an amplitude of typically 300-500 mV at the output. It is advantageous, therefore, to provide, in addition to the limiter, a level converter which is connected downstream and converts the signal supplied by the limiter into a regular logic signal having a signal amplitude of 2.5 V, for example. If the signal converter unit comprises such means for the limiting and level matching of the in-phase signal and of the quadrature signal, the XOR gate arranged downstream may be embodied using digital technology. Combination of the means for the limiting and level matching of the in-phase signal and of the quadrature signal with a digital XOR gate may once again result in the sign of the output signal varying in a manner dependent on the product of the signs of the in-phase signal and of the quadrature signal.

In accordance with an alternative embodiment of the invention, the signal converter unit comprises a multiplier stage for multiplying the in-phase signal and the quadrature signal, the in-phase signal and the quadrature signal being embodied as analog signals. A multiplier stage which multiplies the analog in-phase signal by the analog quadrature signal can also be used to enable the sign of the output signal of the signal converter unit to vary in a manner dependent on the product of the signs of the in-phase signal and of the quadrature signal. If both the in-phase signal and the quadrature signal have positive values, then a positive value also results for the multiplication result. Even if both the in-phase signal and the quadrature signal have negative values, the multiplication yields a positive result. A negative sign of the output signal of the multiplier stage results, by contrast, if the in-phase signal and the quadrature signal have opposite signs.

By multiplying the slowly varying in-phase signal by the slowly varying quadrature signal, the multiplier stage generates a rapidly varying output signal which has an approximately doubled carrier frequency compared with the in-phase signal or the quadrature signal. The circuitry outlay for implementing an analog multiplier is low, so that, in this embodiment, too, the signal converter unit can be realized in a simple and cost-effective manner.

It is advantageous if the means for determining the period duration or the frequency have edge detectors for detecting the signal edges of the output signal of the signal converter unit. Edge detectors of this type generate a trigger pulse upon each rising or falling signal edge of the output signal of the signal converter unit, which trigger pulse serves as start or stop pulse for the determination of the period duration. Edge detectors of this type therefore enable a continual determination of the period duration or of the frequency of the rapidly varying output signal supplied by the signal converter unit.

It is advantageous if the means for determining the period duration or the frequency comprise both edge detectors for detecting the rising signal edges and edge detectors for detecting the falling signal edges. In order to attain a reliable demodulation of the phase- or frequency-modulated output signal of the signal converter unit, the period duration or frequency of said signal must be determined sufficiently often. For this purpose, the signal converter unit according to the invention supplies an output signal which oscillates more rapidly than the underlying in-phase signal or quadrature signal. In order that the information contained in said signal can be extracted as completely as possible for the purpose of demodulation, both the rising and the falling signal edges must be converted into trigger pulses for the period duration measurement. As a result, a high event rate is obtained for the trigger pulses for the period duration measurement, so that the period duration or the frequency can be determined once for each half-cycle of the output signal of the signal converter unit.

In accordance with one advantageous embodiment of the invention, the means for determining the period duration or the frequency have at least one counting discriminator for detecting the time intervals between successive rising or falling signal edges. With a counting discriminator, it is possible to determine the length of the time intervals between successive rising or falling signal edges in digital form. One advantage when using counting discriminators for determining the period duration or the frequency is the high accuracy of the result obtained. Since the period duration is measured digitally, the measurement result is largely independent of process fluctuations and of tolerances of the components used.

In this case, it is advantageous if the at least one counting discriminator comprises a counter whose counter reading is counted up by a counting clock, the counter being read and reset with each pulse of the edge detector. The counter thus detects the number of counting clocks between two successive pulses of the edge detector. Since the counter is read and reset in one step, the period duration can be detected by the counter for directly successive periods of the output signal of the signal converter unit. This enables the period duration or the frequency of the output signal of the signal converter unit to be permanently determined.

In accordance with an alternative embodiment of the invention, the means for determining the period duration or the frequency have at least one integrator, which integrates the output signal generated by the signal converter unit. If the output signal is generated with the aid of an XOR gate, then a signal which is constant over a period duration results as output signal. If this signal is then integrated with the aid of the integrator, then the signal which can be tapped off at the output of the integrator is proportional to the period duration of the output signal. The integrator can be reset by the trigger pulses of the edge detector in order then to effect integration over the period duration of the subsequent half-cycle of the output signal.

In accordance with a further advantageous embodiment of the invention, the means for determining the period duration or the frequency comprise at least one 1/x element, with which the detected period durations can be converted into values proportional to the frequency. Both by means of the counting discriminator and by means of the integrator that can be used as an alternative, a sequence of measured period durations is generated during the evaluation of the output signal generated by the signal converter unit. Although it is possible to perform the demodulation of the frequency- or phase-modulated input signal on the basis of this sequence of period durations, the conversion of the sequence of period durations into a sequence of frequency values has the advantage that the further evaluation and demodulation can then be effected on the basis of frequency-proportional values. With the aid of a sequence of frequency-proportional values, the frequency modulation of the received signal can be evaluated better and with higher accuracy than would be possible with the sequence of period durations.

The demodulator according to the invention is suitable for use in a radio station, and in particular for use in a radio station which is designed for data transmission in accordance with one of the standards DECT or Bluetooth. In the case of the DECT and Bluetooth transmission standards, the received radiofrequency signal has to be downconverted to an intermediate frequency. In principle, although it would also be conceivable to downconvert the received radiofrequency signal immediately to the frequency zero, the received radiofrequency signal has a non-negligible frequency offset in the case of the DECT and Bluetooth standards. In the case where the radiofrequency signal is downconverted to the frequency zero, said frequency offset means that it is no longer possible to distinguish unambiguously between positive and negative frequency shifts, because the frequency offset shifts the frequency zero point. Therefore, the received radiofrequency signal has to be downconverted to an intermediate frequency not equal to zero in the case of the DECT and Bluetooth standards, the use of an intermediate frequency that is as low as possible being recommendable owing to the easier implementability of the channel filters and owing to the tolerances to be taken into consideration. These requirements are met by the solution according to the invention.

In the invention's method for demodulating radiofrequency signals, in particular mobile radio signals, the radiofrequency signal is first of all downconverted into an intermediate frequency range. An in-phase signal and also a quadrature signal are generated in this case. Afterward, the in-phase signal and also the quadrature signal are converted into an output signal of increased carrier frequency, the sign of which is varied in a manner dependent on the product of the signs of the in-phase signal and of the quadrature signal. Afterwards, the period duration or the frequency of the output signal may be determined.

When a low-frequency intermediate frequency is used, the oscillation of the in-phase signal and of the quadrature signal is too slow to enable a reliable demodulation. The solution according to the invention therefore provides for a more rapidly oscillating signal to be generated from these two signals, which signal can correspondingly be easily demodulated. For this purpose, the sign of the output signal generated is varied in a manner dependent on the product of the signs of the in-phase signal and of the quadrature signal, and the carrier frequency is thereby approximately doubled. Only a low structural outlay is required for realizing the method according to the invention; the method can be implemented very simply.

BRIEF DESCRIPTION OF THE DRAWINGS

The invention is described in more detail below using a plurality of exemplary embodiments illustrated in the drawing, in which:

FIG. 2A shows a second exemplary embodiment of the invention, in which the signal conversion is performed by means of an XOR gate and the period duration determination is performed by means of a counting discriminator;

FIG. 2B shows a third exemplary embodiment of the invention, in which the limiting stage and the XOR gate have been interchanged in comparison with the solution shown in FIG. 2A;

DETAILED DESCRIPTION OF THE INVENTION

Figure 1:
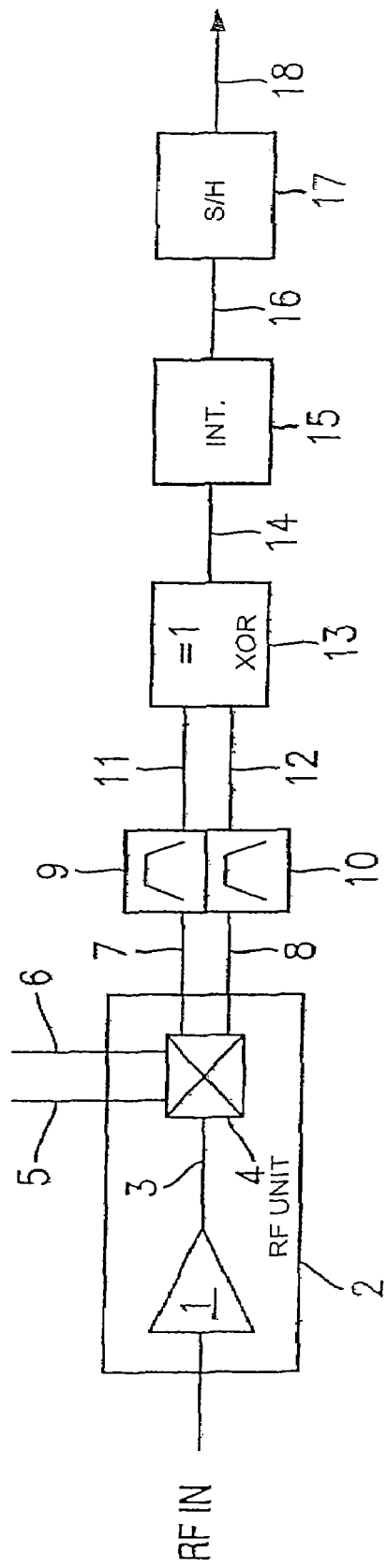
FIG. 1 shows a first exemplary embodiment of the invention, in which an XOR gate is used for the purpose of signal conversion and an integrator is used for the purpose of period duration determination.

FIG. 1 illustrates a first exemplary embodiment of the invention. In this case, the received radiofrequency signal RF IN is fed to the amplifier 1 of the radiofrequency unit 2. The amplified radiofrequency signal 3 passes to the mixer 4, where it is downconverted into the intermediate frequency range with the aid of the two signals 5 and 6 of the local oscillator, said signals being phase-shifted by 90° relative to one another. The two intermediate frequency signals thus generated, the in-phase signal 7 and also the quadrature signal 8, are subsequently subjected to a channel filtering in order to mask out signal components lying outside the intermediate frequency range. For this purpose, the channel filter 9 is provided for the in-phase signal and the channel filter 10 is provided for the quadrature signal, at the output of which filters it is possible to tap off the channel-filtered in-phase signal 11 and also the channel-filtered quadrature signal 12. The channel filters 9 and 10 may be complex bandpass filters, which carry out image frequency suppression in addition to the bandpass filtering. In particular, the channel filters 9 and 10 may be embodied as polyphase filters.

The channel-filtered in-phase signal 11 and also the channel-filtered quadrature signal 12 are fed to the analog XOR gate 13. If both signals are positive, the output signal 14 of the XOR gate assumes the value 1. The output signal 14 of the XOR gate also assumes the value 1 if both signals are negative. By contrast, if the signs of the channel-filtered in-phase signal 11 and of the channel-filtered quadrature signal 12 differ, then the output signal 14 of the XOR gate assumes the value −1. The XOR combination of the slowly varying in-phase signal and of the slowly varying quadrature signal thus generates a rapidly oscillating output signal 14, the carrier frequency of which is approximately twice as high as the carrier frequency of the underlying in-phase signal or quadrature signal.

In order to continually determine the period duration, the output signal 14 is fed to the integrator 15, which integrates the output signal 14 in each case between two successive changes of sign. The integrated signal 16, which represents a measure of the period duration between two successive changes of sign, is in each case present at the output of the integrator 15. The integrated signal 16 is fed to the sample/hold element 17, which stores the value of the integrated signal 16 in each case until the previous value of the integrated signal 16 is replaced by a new value. A sequence of period values is obtained as signal 18 through regular reading of the sample/hold element 17, and the further demodulation of the received signal can be performed on the basis of these values. It is also possible to convert the sequence of period durations into a sequence of frequency values before the demodulation with the aid of a 1/x element. Proceeding from the sequence of frequency values, the demodulation can be carried out with high accuracy.

FIG. 2A shows a further exemplary embodiment of the invention, in which the period durations are determined using a counting discriminator rather than using an integrator. Once again the radiofrequency signal RF IN is fed to an amplifier 1 and also to a mixer 4 connected downstream in a radiofrequency unit 2, which generates the in-phase signal 7 and also the quadrature signal 8. After filtering by the channel filters 9 and 10, the channel-filtered in-phase signal 11 and also the channel-filtered quadrature signal 12 are fed to the analog XOR gate 13, at the output of which the rapidly varying output signal 14 is present. The sign of the output signal 14 is varied in a manner dependent on the product of the signs of the channel-filtered in-phase signal 11 and also of the channel-filtered quadrature signal 12. The output signal 14 is present at the input of the limiting unit 19, which amplifies the output signal 14 to such a great extent that either a positive maximum value of +300 to +500 mV or a negative minimum value of −300 to −500 mV is present at the output of the limiting unit 19. Each positive input value of the limiting unit is thus converted into the positive maximum value, while each negative input value is converted into the negative minimum value. As a result, a quasi-digital "rail-to-rail" signal is obtained, and this signal is fed to the level converter 20 arranged downstream. The level converter 20 converts the limited signal, which has amplitudes of ±300 to ±500 mV, to signal levels of a few volts (typically 2.5 V). The limited, level-matched signal 21 is fed to the edge detector 22, which comprises both means for detecting rising signal edges and means for detecting falling signal edges and generates a trigger pulse upon each signal edge that occurs. The trigger signal 23 is present at the input of the counting discriminator 24, which in each case measures the period duration between two successive trigger pulses. For this purpose, the counting discriminator 24 comprises a counter whose counter reading is counted up by a high-frequency counting clock. A counting clock of approximately 100 MHz is typically used. The present counter reading is read out upon each trigger pulse which occurs at the input of the counting discriminator 24. In addition, the counter is reset to zero. The counter reading 25 thus determined represents a measure of the time duration of the preceding period of the output signal 14. The counter reading 25 is in each case forwarded to the sample/hold element 26, where it overwrites the value stored last. A sequence of digitally measured period durations is obtained as signal 27 through regular reading of the sample/hold element 26, and the further demodulation of the signal can then be performed on the basis of this sequence.

In principle, the analog/digital conversion of the signals downconverted into the intermediate frequency range can be carried out upstream of the XOR gate, downstream of the XOR gate or downstream of the sample/hold element. While the limiting and level conversion have been carried out after the XOR combination of the in-phase signal and of the quadrature signal in the embodiment shown in FIG. 2A, the XOR gate already processes the limited and level-matched signals in the solution shown in FIG. 2B. For this purpose, both the channel-filtered in-phase signal 11 and the channel-filtered quadrature signal 12 are fed to the limiting unit 28, which converts both the in-phase signal and the quadrature signal into quasi-digital "rail-to-rail" signals, which are then converted into the limited, level-matched in-phase signal 30 and into the limited, level-matched quadrature signal 31 by the level converter 29. These two signals are converted into a rapidly oscillating output signal 33 by the digital XOR gate 32.

The edge detector 34 determines the positive and negative signal edges and communicates a trigger signal 35 to the counting discriminator 36. The counting discriminator 36 measures the time intervals between successive trigger pulses and thus generates a sequence of period durations, which is communicated as signal 37 to the sample/hold element 38, where the values of the period duration are buffer-stored. The signal 39 is obtained by reading the sample/hold element 38, which signal is then used for the further signal demodulation.

The method according to the invention is suitable in particular for the demodulation of received signals which are transmitted according to the DECT standard or in accordance with the Bluetooth standard; however, the use of the invention is not restricted to these transmission methods. The DECT and Bluetooth standards make use of the modulation method GMSK (Gaussian Minimum Shift Keying), in which the frequency and phase changes between successively transmitted data symbols are not effected abruptly. Instead, soft fade-overs—controlled by Gaussian pulses—between the various frequency and phase states are performed.

In this case, the use of a low intermediate frequency of 1 MHz results in a frequency range of 1 MHz±170 kHz for the in-phase signal and the quadrature signal. In the method according to the invention, the carrier frequency of the signal to be evaluated is doubled by combining the in-phase signal and also the quadrature signal. Both the positive and the negative signal edges are detected for the evaluation of this signal, so that four period duration measurements are carried out during each clock period of the in-phase signal. If the counter of the counting discriminator is operated with a frequency of 100 MHz, then a range of values of:

$$\left(\frac{(1\ \text{MHz} \pm 170\ \text{kHz}) \cdot 4}{100\ \text{MHz}}\right)^{-1}$$

results for the number of counting clocks counted during a period duration. Therefore, for the frequency-modulated intermediate frequency signal, between 21 counting pulses and 30 counting pulses are determined per period duration. Given this resolution, carrying out four period duration or frequency measurements per fundamental oscillation of the intermediate frequency signal affords a sufficient accuracy for the tracking and evaluation of the frequency modulation.

Figure 3A:
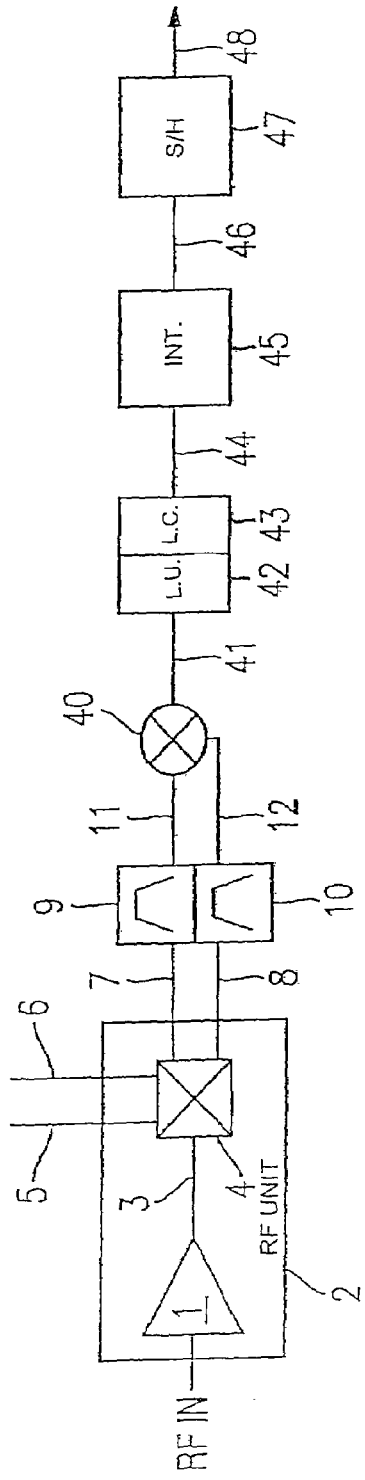
FIG. 3A shows a fourth exemplary embodiment of the invention, in which a multiplier stage is used for the purpose of signal conversion and an integrator is used for the purpose of period duration determination.
Figure 3B:
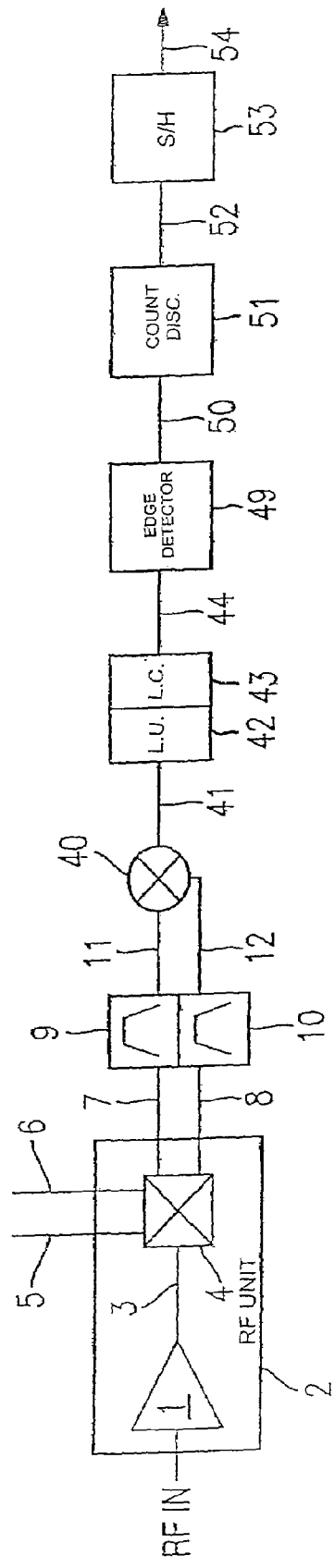
FIG. 3B shows a fifth exemplary embodiment of the invention, in which a multiplier stage is used for the purpose of signal conversion and a counting discriminator is used for the purpose of period duration determination.

FIGS. 3A and 3B show alternative embodiments of the invention in which a multiplier stage is used for combining the in-phase signal and the quadrature signal. This can be identified from FIG. 3A. In the multiplier stage 40, the channel-filtered in-phase signal 11 is multiplied by the channel-filtered quadrature signal 12 in order thus to obtain the analog output signal 41. In this case, the sign of the analog output signal 41 varies in a manner dependent on the product of the signs of the in-phase signal 11 and of the quadrature signal 12. As a consequence of this, the analog output signal 41 oscillates approximately twice as rapidly as the underlying intermediate frequency signals 11 and 12. The analog output signal 41 is converted into the limited, level-matched output signal 44 by the limiting unit 42 and the level converter 43. In the solution shown in FIG. 3A, this signal is evaluated further with the aid of the integrator 45. The integrator 45 integrates the output signal 44 in each case between two successive signal edges and thus generates an analog measured value for the period duration. This integrated signal 46 is passed to the sample/hold element 47 and buffer-stored there. The signal 48 can be read out from the sample/hold element 47 as a sequence of period durations, which signal is used for the demodulation.

In the solution shown in FIG. 3B, too, the analog output signal 41 of the multiplier stage 40 is converted into a limited, level-matched output signal 44 with the aid of the limiting unit 42 and the level matching unit 43. This signal is fed to the edge detector 49, which generates a trigger pulse on each positive or negative signal edge. On the basis of the trigger signal 50, the counting discriminator 51 determines digital measured values for the interval lengths between successive trigger pulses. These period duration values are fed as signal 52 to the sample/hold element 53 and buffer-stored there. The signal 54 is obtained by reading the sample/hold element 53, and the frequency modulation of the intermediate frequency signal can be evaluated on the basis of said signal.

The invention claimed is:

1. A demodulator for demodulating radiofrequency signals, comprising:
a mixer, which downconverts the radiofrequency signal into an intermediate frequency range, the mixer generating an in-phase signal and also a quadrature signal,
a signal converter unit, which converts the in-phase signal and also the quadrature signal into an output signal of increased carrier frequency, the signal converter unit varying the sign of the output signal in a manner dependent on the product of the signs of the in-phase signal and of the quadrature signal, and
determining means for determining the period duration or the frequency of the output signal generated by the signal converter unit.

2. The demodulator as claimed in claim 1, wherein
the demodulator further comprises channel filters for the in-phase signal and the quadrature signal, which are connected downstream of the mixer and suppress, at least in part, frequencies outside the intermediate frequency range.

3. The demodulator as claimed in claim 2, wherein
the channel filters comprise complex bandpass filters.

4. The demodulator as claimed in claims 1, wherein
the signal converter unit comprises means for an XOR combination of the in-phase signal and of the quadrature signal.

5. The demodulator as claimed in claim 4, wherein
the in-phase signal and the quadrature signal are embodied as analog signals, and in that the means for the XOR combination of the in-phase signal and of the quadrature signal are embodied using analog technology.

6. The demodulator as claimed in claim 4, wherein
the signal converter unit comprises means for limiting and level matching of the in-phase signal and of the quadrature signal and in that the means for the XOR combination of the in-phase signal and of the quadrature signal are embodied using digital technology and combine the limited, level-matched signals.

7. The demodulator as claimed in claims 1, wherein
the signal converter unit comprises a multiplier stage for multiplying the in-phase signal and the quadrature signal, the in-phase signal and the quadrature signal being embodied as analog signals.

8. The demodulator as claimed in claim 1, wherein
the determining means for determining the period duration or the frequency comprises edge detectors for detecting the signal edges of the output signal of the signal converter unit.

9. The demodulator as claimed in claim 8, wherein
the determining means for determining the period duration or the frequency comprises edge detectors for detecting the rising signal edges and edge detectors and for detecting the falling signal edges.

10. The demodulator as claimed in claim 1, wherein
the determining means for determining the period duration or the frequency comprises at least one counting discriminator for detecting the time intervals between successive rising or falling signal edges.

11. The demodulator as claimed in claim 10, wherein
the at least one counting discriminator comprises a counter whose counter reading is counted up by a counting clock, the counter being read and reset with each pulse of the edge detector.

12. The demodulator as claimed in claim 1, wherein
the determining means for determining the period duration or the frequency comprises at least one integrator which integrates the output signal generated by the signal converter unit.

13. The demodulator as claimed in claim 1, wherein
the determining means for determining the period duration or the frequency comprises at least one conversion element, with which the detected period durations are converted into values proportional to the frequency.

14. A radio station, which comprises a demodulator as claimed in claim 1.

15. A method for demodulating radiofrequency signals, comprising:
a) downconverting the radiofrequency signal into an intermediate frequency range and generation of an in-phase signal and also of a quadrature signal;
b) converting the in-phase signal and of the quadrature signal into an output signal of increased carrier frequency, the sign of which is varied in a manner dependent on the product of the signs of the in-phase signal and of the quadrature signal; and
c) determining the period duration or of the frequency of the output signal.

16. The method as claimed in claim 15, wherein
the in-phase signal and the quadrature signal are converted into the output signal by means of an XOR combination.

17. The method as claimed in claim 15, wherein
the output signal is obtained by multiplication of the in-phase signal by the quadrature signal.

18. The method as claimed in claim 15, wherein
signal edges of the output signal are detected in order to determine the period duration or the frequency of the output signal.

19. The method as claimed in claim 18, wherein
the time intervals between successive rising or falling signal edges are detected in order to determine the period duration or the frequency of the output signal.

20. The method as claimed in claim 15, further comprising
integrating the output signal in order to determine the period duration or the frequency of the output signal.

21. The demodulator of claim 1, wherein the intermediate frequency range does not comprise the frequency of zero.

* * * * *